US012654254B2

(12) United States Patent
Genda

(10) Patent No.: US 12,654,254 B2
(45) Date of Patent: Jun. 16, 2026

(54) FACET REGION DETECTION METHOD AND WAFER GENERATION METHOD

(71) Applicant: DISCO CORPORATION, Tokyo (JP)

(72) Inventor: Satoshi Genda, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 1046 days.

(21) Appl. No.: 17/805,548

(22) Filed: Jun. 6, 2022

(65) Prior Publication Data

US 2022/0410305 A1    Dec. 29, 2022

(30) Foreign Application Priority Data

Jun. 24, 2021    (JP) ................................. 2021-104928

(51) Int. Cl.
| | |
|---|---|
| *B23K 26/00* | (2014.01) |
| *B23K 26/53* | (2014.01) |
| *G01N 21/64* | (2006.01) |
| *H10P 52/00* | (2026.01) |
| *H10P 54/00* | (2026.01) |
| *B23K 101/40* | (2006.01) |
| *B23K 103/00* | (2006.01) |

(52) U.S. Cl.
CPC .......... *B23K 26/0006* (2013.01); *B23K 26/53* (2015.10); *G01N 21/6489* (2013.01); *H10P 52/00* (2026.01); *H10P 54/00* (2026.01); *B23K 2101/40* (2018.08); *B23K 2103/56* (2018.08)

(58) Field of Classification Search
CPC ................ B23K 26/53; B23K 2103/56; G01N 21/6489; G01N 21/646; G01N 21/9505; H10P 52/00; H10P 54/00
See application file for complete search history.

(56) References Cited

U.S. PATENT DOCUMENTS

| | | |
|---|---|---|
| 2016/0084764 A1 | 3/2016 | Trupke |
| 2020/0064269 A1* | 2/2020 | Murazawa ......... G01N 21/6489 |

FOREIGN PATENT DOCUMENTS

| JP | 2016111143 A | 6/2016 |
|---|---|---|
| JP | 2020077783 A | 5/2020 |

OTHER PUBLICATIONS

Search Report issued in counterpart European Patent Application No. EP 22 17 9858, dated Nov. 11, 2022.

\* cited by examiner

*Primary Examiner* — Khiem D Nguyen
(74) *Attorney, Agent, or Firm* — GREER BURNS & CRAIN, LTD.

(57) ABSTRACT

A facet region detection method includes a first irradiation step and a second irradiation step in which a first surface and a second surface, respectively, of an ingot are irradiated with light, and a first fluorescence detection step and a second fluorescence detection step in which distribution of the number of photons of fluorescence in the first surface and the second surface, respectively, is obtained. The facet region detection method further includes a first determination step and a second determination step in which a facet region and a non-facet region are determined in the first surface and the second surface on a basis of the number of photons of the fluorescence, and a calculation step in which an estimated position of a facet region inside the ingot is calculated based on the facet region in the first surface and the facet region in the second surface.

2 Claims, 8 Drawing Sheets

FACET REGION DETECTION METHOD AND WAFER GENERATION METHOD

BACKGROUND OF THE INVENTION

Field of the Invention

The present invention relates to a facet region detection method, a wafer generation method, a detection apparatus, and a laser processing apparatus.

Description of the Related Art

As a related art regarding a manufacturing method of a semiconductor wafer, a method in which a wafer is cut out from an ingot with a circular column shape by using a wire saw is known. However, there is a problem that the cutting-out by the wire saw is not economical because a large part of the ingot is lost as the kerf loss (cutting allowance). Further, there is another problem that, since an SiC single-crystal used as a power device has high hardness, a long time is taken for the cutting-out and the productivity is low. In order to solve these problems, a method has been proposed in which a focal point of a laser beam is positioned inside an ingot and scanning with the focal point is executed to slice a plate-shaped workpiece from the ingot (refer to Japanese Patent Laid-open No. 2016-111143).

Incidentally, the SiC single-crystal sometimes includes a region that is referred to as a facet region, that has high impurity concentration, and that has a high refractive index and a high energy absorptance compared with the other region (non-facet region). When the facet region exists, there is a possibility that, when a separation layer is formed inside an ingot by irradiation with a laser beam, the depth position of the separation layer becomes uneven and the kerf loss increases. Thus, a laser processing apparatus that identifies the facet region and the non-facet region and irradiates the two regions with a laser beam under different irradiation conditions has been proposed (refer to Japanese Patent Laid-open No. 2020-077783).

SUMMARY OF THE INVENTION

However, the facet region is not necessarily formed perpendicularly inside the ingot. Therefore, there is a problem that the facet region on the surface irradiated with the laser beam moves every time a wafer is separated, so that detection is required each time, and a long time is thus taken.

Accordingly, an object of the present invention is to provide a facet region detection method, a wafer generation method, a detection apparatus, and a laser processing apparatus that can estimate the position of a facet region inside an ingot.

In accordance with an aspect of the present invention, there is provided a detection method of a facet region for detecting the facet region of an SiC single-crystal ingot having a first surface and a second surface that is a surface on the opposite side to the first surface. The detection method of a facet region includes a first irradiation step of irradiating the first surface of the SiC single-crystal ingot with light from a light source, a first fluorescence detection step of detecting fluorescence generated from the first surface of the SiC single-crystal ingot by the light with which the first surface is irradiated and obtaining the distribution of the number of photons of the fluorescence, and a first determination step of determining a facet region and a non-facet region in the first surface on a basis of the number of photons of the fluorescence detected in the first fluorescence detection step with a predetermined value as a boundary. The detection method of a facet region includes also a second irradiation step of irradiating the second surface of the SiC single-crystal ingot with the light from the light source, a second fluorescence detection step of detecting fluorescence generated from the second surface of the SiC single-crystal ingot by the light with which the second surface is irradiated and obtaining the distribution of the number of photons of the fluorescence, and a second determination step of determining a facet region and a non-facet region in the first surface on a basis of the number of photons of the fluorescence detected in the second fluorescence detection step with a predetermined value as a boundary. The detection method of a facet region includes also a calculation step of calculating an estimated position of the facet region inside the SiC single-crystal ingot on the basis of the facet region determined in the first surface in the first determination step and the facet region determined in the second surface in the second determination step.

In accordance with another aspect of the present invention, there is provided a generation method of a wafer for generating the wafer from an SiC single-crystal ingot having a first surface and a second surface that is a surface on the opposite side to the first surface. The generation method of a wafer includes a first irradiation step of irradiating the first surface of the SiC single-crystal ingot with light from a light source, a first fluorescence detection step of detecting fluorescence generated from the first surface of the SiC single-crystal ingot by the light with which the first surface is irradiated and obtaining the distribution of the number of photons of the fluorescence, and a first determination step of determining a facet region and a non-facet region in the first surface on a basis of the number of photons of the fluorescence detected in the first fluorescence detection step with a predetermined value as a boundary. The generation method of a wafer includes also a second irradiation step of irradiating the second surface of the SiC single-crystal ingot with the light from the light source, a second fluorescence detection step of detecting fluorescence generated from the second surface of the SiC single-crystal ingot by the light with which the second surface is irradiated and obtaining the distribution of the number of photons of the fluorescence, and a second determination step of determining a facet region and a non-facet region in the second surface on a basis of the number of photons of the fluorescence detected in the second fluorescence detection step with a predetermined value as a boundary. The generation method of a wafer includes also a calculation step of calculating an estimated position of the facet region inside the SiC single-crystal ingot on the basis of the facet region determined in the first surface in the first determination step and the facet region determined in the second surface in the second determination step, a laser beam irradiation step of positioning the focal point of a laser beam with a wavelength having transmissibility with respect to the SiC single-crystal ingot to a depth corresponding to the thickness of the wafer to be generated inside the SiC single-crystal ingot and executing irradiation and forming a separation layer in the SiC single-crystal ingot by relatively moving the focal point and the SiC single-crystal ingot in directions parallel to the first surface, a separation step of separating the wafer to be generated from the SiC single-crystal ingot with the separation layer being an interface, and a grinding step of grinding a separation surface of the SiC single-crystal ingot after the separation step. The generation method of a wafer includes also an estimation step of estimating the position of the facet region on an irradiated surface of the laser beam on the basis of the estimated position of the facet region inside the SiC single-crystal ingot calculated in the calculation step and the thickness of the SiC single-crystal ingot that has decreased due to the separation of the wafer from the SiC single-crystal ingot after the calculation step and before the laser beam irradiation step and a setting step of setting an irradiation condition of the laser beam with which the estimated facet region on the irradiated surface is irradiated to an irradiation condition different from an irradiation condition of the laser beam with which the non-facet region is irradiated after the estimation step and before the laser beam irradiation step.

In accordance with a further aspect of the present invention, there is provided a detection apparatus that detects a facet region of an SiC single-crystal ingot having a first surface and a second surface that is a surface on the opposite side to the first surface. The detection apparatus includes a light source that irradiates the SiC single-crystal ingot with light, a fluorescence detection unit that detects fluorescence generated from the first surface and the second surface by the light with which the first surface and the second surface are irradiated from the light source and obtains the distribution of the number of photons of the fluorescence, a determining section that determines the position of the facet region in the first surface of the SiC single-crystal ingot and the position of the facet region in the second surface on the basis of the distribution of the number of photons of the fluorescence detected by the fluorescence detection unit, and a calculating section that calculates an estimated position of the facet region inside the SiC single-crystal ingot on the basis of the position of the facet region in the first surface and the position of the facet region in the second surface determined by the determining section.

In accordance with a still further aspect of the present invention, there is provided a laser processing apparatus that forms a separation layer in an SiC single-crystal ingot having a first surface and a second surface that is a surface on the opposite side to the first surface. The laser processing apparatus includes a light source that irradiates the SiC single-crystal ingot with light, a fluorescence detection unit that detects fluorescence generated from the first surface and the second surface by the light with which the first surface and the second surface are irradiated from the light source and obtains the distribution of the number of photons of the fluorescence, and a holding unit having a holding surface that holds the SiC single-crystal ingot. The laser processing apparatus includes also a laser beam irradiation unit that positions the focal point of a laser beam with a wavelength having transmissibility with respect to the SiC single-crystal ingot to a depth corresponding to the thickness of a wafer to be generated inside the SiC single-crystal ingot and executes irradiation to form the separation layer, a movement unit that relatively moves the holding unit and the focal point of the laser beam in directions parallel to the holding surface, and a control unit. The control unit has a determining section that determines the position of a facet region in the first surface of the SiC single-crystal ingot and the position of the facet region in the second surface on the basis of the distribution of the number of photons of the fluorescence detected by the fluorescence detection unit, a calculating section that calculates an estimated position of the facet region inside the SiC single-crystal ingot on the basis of the position of the facet region in the first surface and the position of the facet region in the second surface determined by the determining section, and an estimating section that estimates the position of the facet region on an irradiated surface of the laser beam on the basis of the estimated position of the facet region inside the SiC single-crystal ingot calculated in the calculating section and the thickness of the SiC single-crystal ingot that has decreased due to separation of the wafer from the SiC single-crystal ingot.

The facet region detection method, the wafer generation method, the detection apparatus, and the laser processing apparatus according to the respective aspects of the present invention can estimate the position of the facet region inside the ingot.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
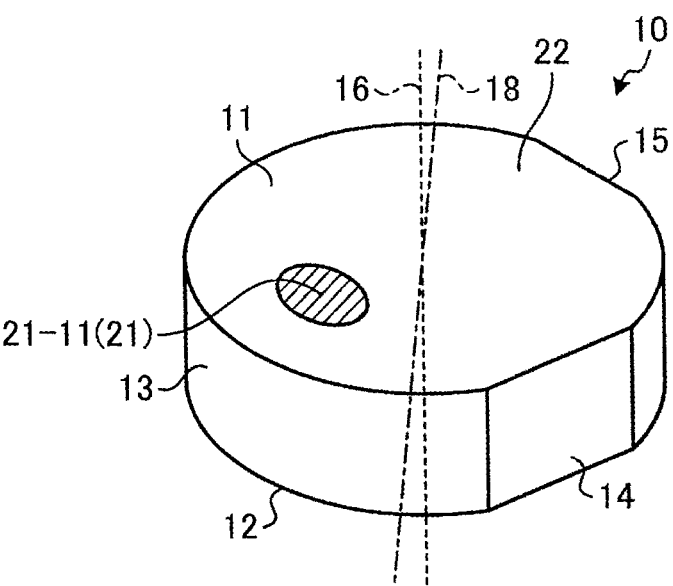
FIG. 1 is a perspective view of an ingot that is a detection target of a facet region detection method according to an embodiment.

An embodiment of the present invention will be described below with reference to the accompanying drawings. However, the present invention is not limited to contents described in the following embodiment. Further, what can easily be envisaged by those skilled in the art and what substantially are the same are included in constituent elements described below. Moreover, configurations described below can be combined as appropriate. In addition, various kinds of omission, replacement, or change of a configuration can be carried out without departing from the gist of the present invention.

Embodiment

A method for detecting a facet region 21, a method for generating a wafer 30, and a detection apparatus according to the embodiment will be described based on drawings. In the embodiment described below, the detection apparatus is included in a laser processing apparatus 100. The method for detecting the facet region 21 according to the embodiment is a method in which an estimated position of the facet region 21 inside an ingot 10 illustrated in FIG. 8 and so forth is calculated from the ingot 10 illustrated in FIG. 1 and FIG. 2 by using the detection apparatus (laser processing apparatus 100) illustrated in FIG. 3 and FIG. 4. Furthermore, the method for generating the wafer 30 according to the embodiment is a method in which the wafer 30 illustrated in FIG. 11 and so forth is generated from the ingot 10 for which the estimated position of the facet region 21 inside the ingot 10 has been calculated.

(SiC Single-crystal Ingot)

Figure 2:
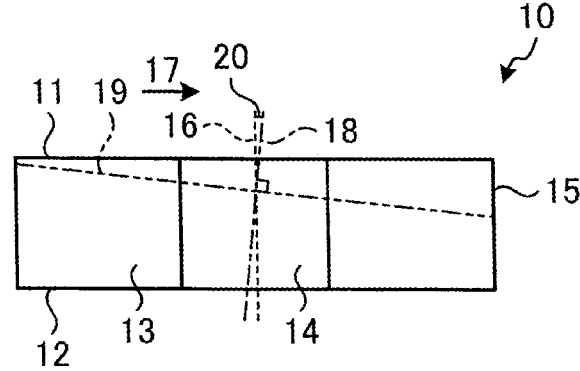
FIG. 2 is a side view of the ingot illustrated in FIG. 1.

First, a configuration of the ingot 10 that is a detection target of the method for detecting the facet region 21 according to the embodiment of the present invention will be described. FIG. 1 is a perspective view of the ingot 10 that is the detection target of the method for detecting the facet region 21 according to the embodiment. FIG. 2 is a side view of the ingot 10 illustrated in FIG. 1.

The ingot 10 of the embodiment illustrated in FIG. 1 and FIG. 2 is a semiconductor ingot composed of silicon carbide (SiC) and is a single-crystal SiC ingot formed into a circular column shape as a whole. The ingot 10 is a hexagonal single-crystal SiC ingot in the embodiment. The ingot 10 has a first surface 11, a second surface 12, a circumferential surface 13, a first orientation flat 14, and a second orientation flat 15.

The first surface 11 has a circular shape and is one end surface of the ingot 10 in the circular column shape. The second surface 12 has a circular shape and is an end surface on a side opposite to the first surface 11 in the ingot 10 in the circular column shape. The second surface 12 is equivalent to a bottom surface of the ingot 10. The circumferential surface 13 is a surface continuous with an outer edge of the first surface 11 and an outer edge of the second surface 12.

The first orientation flat 14 is a flat surface formed at part of the circumferential surface 13 in order to indicate a crystal orientation of the ingot 10. The second orientation flat 15 is a flat surface formed at part of the circumferential surface 13 in order to indicate the crystal orientation of the ingot 10. The second orientation flat 15 is orthogonal to the first orientation flat 14. The length of the first orientation flat 14 is longer than that of the second orientation flat 15.

Further, the ingot 10 has a c-axis 18 inclined with respect to a perpendicular line 16 of the first surface 11 by an off-angle 20 in an inclination direction 17 toward the second orientation flat 15 and a c-plane 19 orthogonal to the c-axis 18. The inclination direction 17 of the c-axis 18 from the perpendicular line 16 is orthogonal to an extension direction of the second orientation flat 15 and is parallel to the first orientation flat 14. The c-plane 19 is inclined with respect to the first surface 11 of the ingot 10 by the off-angle 20.

An infinite number of c-planes 19 are set in the ingot 10 at a molecular level of the ingot 10. In the ingot 10, the off-angle 20 is set to 1°, 4°, or 6° in the embodiment. However, the ingot 10 may be manufactured with the off-angle 20 freely set in a range of, for example, 1° to 6° in the present invention. For the ingot 10, grinding processing of the first surface 11 is executed by a grinding apparatus, and thereafter, polishing processing is executed by a polishing apparatus, so that the first surface 11 is formed into a mirror surface.

Moreover, the ingot 10 of the embodiment is formed mainly as a hexagonal single-crystal SiC ingot. However, a facet region 21 locally exists therein. The facet region 21 is formed into a column shape extending from the first surface 11 of the ingot 10 to the second surface 12 (see FIG. 8). In the facet region 21, nitrogen is taken up more readily relatively than in a non-facet region 22 that is a region other than the facet region 21, and therefore, the nitrogen concentration becomes higher than in the other region.

(Laser Processing Apparatus)

Figure 3:
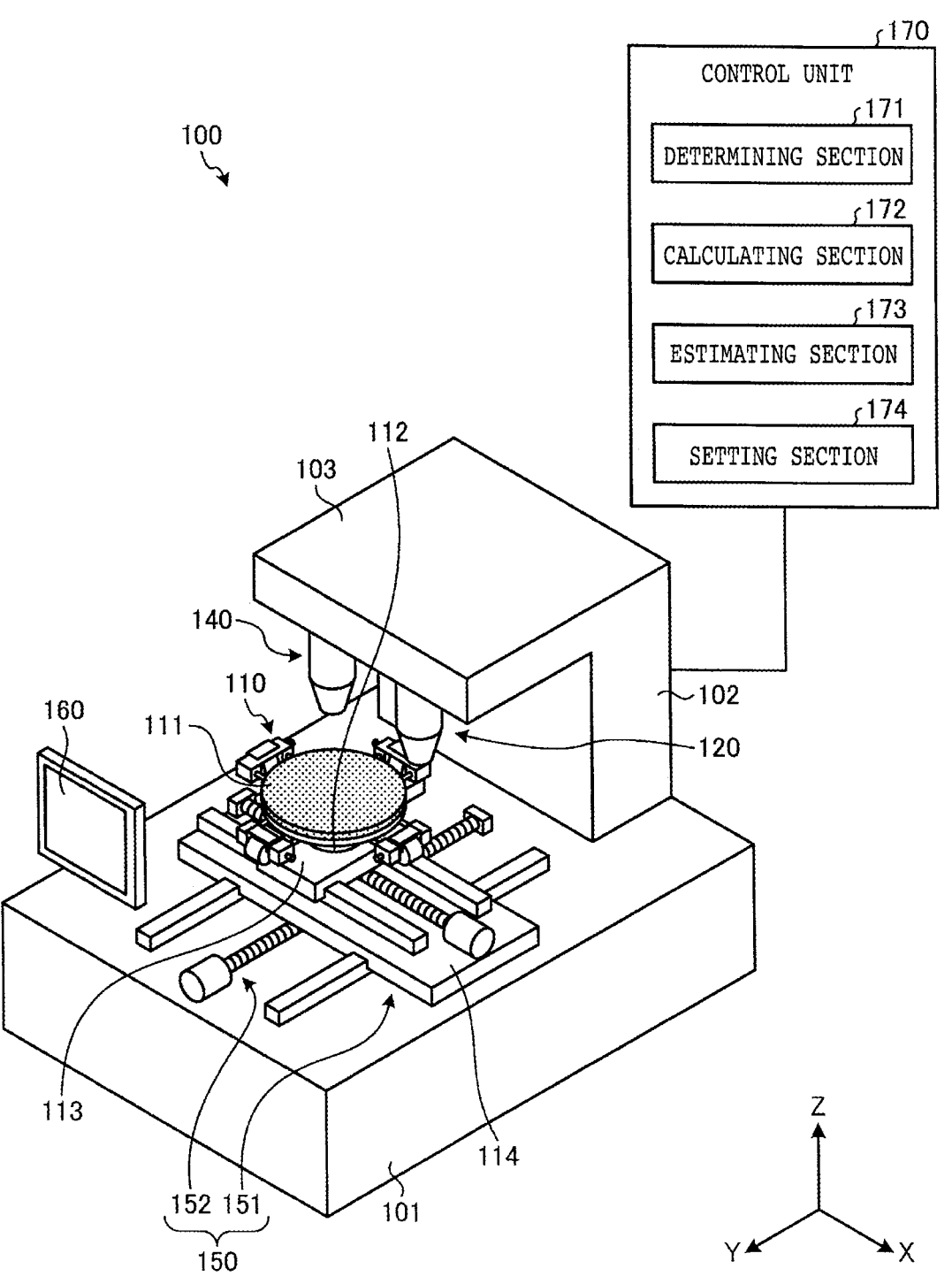
FIG. 3 is a perspective view illustrating a configuration example of a laser processing apparatus including a detection apparatus according to the embodiment.
Figure 4:
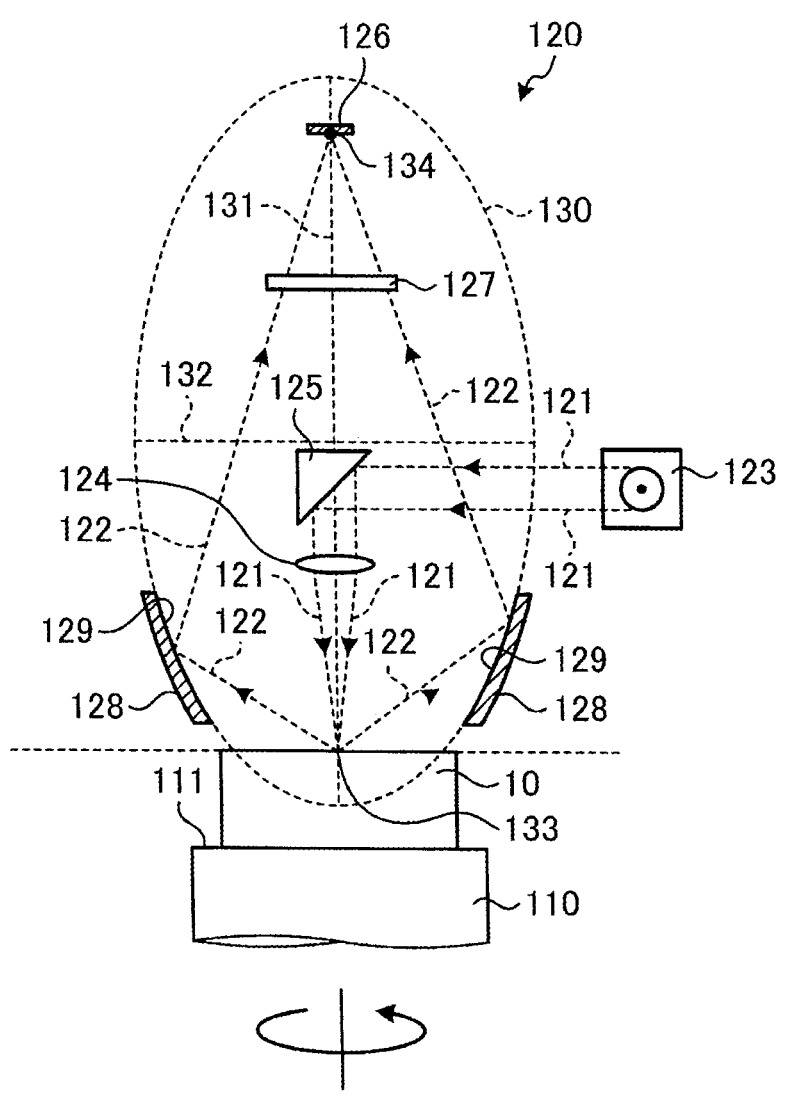
FIG. 4 is a side view for explaining a schematic configuration of a fluorescence detection unit of the laser processing apparatus illustrated in FIG. 3.

Next, a configuration of the laser processing apparatus 100 including the detection apparatus according to the embodiment will be described. FIG. 3 is a perspective view illustrating a configuration example of the laser processing apparatus 100 including the detection apparatus according to the embodiment. FIG. 4 is a side view for explaining a schematic configuration of a fluorescence detection unit 120 of the laser processing apparatus 100 illustrated in FIG. 3. In the following description, an X-axis direction is one direction in a horizontal plane. A Y-axis direction is a direction orthogonal to the X-axis direction in the horizontal plane. A Z-axis direction is a direction orthogonal to the X-axis direction and the Y-axis direction. The laser processing apparatus 100 of the embodiment has a holding unit 100, the fluorescence detection unit 120, a laser beam irradiation unit 140, a movement unit 150, a display unit 160, and a control unit 170.

The holding unit 110 holds the ingot 10 on a holding surface 111 thereof. The holding surface 111 is formed from a porous ceramic or the like and has a circular plate shape. In the embodiment, the holding surface 111 is a flat surface parallel to a horizontal direction. The holding surface 111 connects to a vacuum suction source through a vacuum suction path, for example. The holding unit 110 holds under suction the ingot 10 placed on the holding surface 111.

The holding unit 110 is rotated about its axial center parallel to the Z-axis direction by a rotation unit 112. The rotation unit 112 is supported by an X-axis direction moving plate 113. The rotation unit 112 and the holding unit 110 are moved in the X-axis direction by the movement unit 150 through the X-axis direction moving plate 113. The rotation unit 112 and the holding unit 110 are moved in the Y-axis direction by the movement unit 150 through the X-axis direction moving plate 113 and a Y-axis direction moving plate 114.

The fluorescence detection unit 120 is a unit that irradiates the ingot 10 held on the holding surface 111 of the holding unit 110 with light 121 of a predetermined wavelength from above the ingot 10 and detects fluorescence 122 generated from an upper surface (first surface 11 or second surface 12) of the ingot 10. Part of the fluorescence detection unit 120 is supported by a tip of a support beam 103 extended in the horizontal direction from an upper end part of an erected wall 102 disposed upright from an apparatus main body 101. As illustrated in FIG. 4, the fluorescence detection unit 120 includes a light source 123, a collecting lens 124, an excitation light reflective mirror 125, a light receiving part 126, a band-pass filter 127, and a fluorescence reflective mirror 128.

The light source 123 emits the light 121 having such a wavelength as to be absorbed by the ingot 10. The light source 123 has a gallium nitride (GaN)-based light emitting element, for example.

The collecting lens 124 focuses the light 121 emitted from the light source 123 and irradiates the upper surface of the ingot 10 held on the holding surface 111 of the holding unit 110 with the light 121. The collecting lens 124 is disposed between the excitation light reflective mirror 125 and the ingot 10 in the embodiment. However, the collecting lens 124 may be disposed between the light source 123 and the excitation light reflective mirror 125 in the present invention.

The excitation light reflective mirror 125 reflects the light 121 emitted from the light source 123 to guide the light 121 toward the upper surface of the ingot 10 held on the holding surface 111 of the holding unit 110. In the embodiment, the excitation light reflective mirror 125 reflects the light 121 emitted from the light source 123 toward the collecting lens 124.

The light receiving part 126 detects the number of photons of the fluorescence 122 generated from the upper surface of the ingot 10. For example, the light receiving part 126 includes a highly-sensitive photodetector that transduces light energy to electrical energy by using a photoelectric effect and to which a current amplification (electron multiplication) function is added. For example, the light receiving part 126 is disposed in a vacuum region marked out by a glass tube and outputs an electrical signal indicating the number of photons of the fluorescence 122 by receiving photons of the fluorescence 122 transmitted through the glass tube and generating photoelectrons according to the number of photons. Due to impingement of the photoelectrons generated by the light receiving part 126, secondary electrons are generated one after another, and a current is amplified.

The band-pass filter 127 is disposed at a previous stage of the light receiving part 126. The band-pass filter 127 allows passing of light with a predetermined wavelength in the fluorescence 122 generated from the upper surface of the ingot 10 and removes light with wavelengths other than the predetermined wavelength in the fluorescence 122. Therefore, for example, even when part of the light 121 is scattered and travels toward the light receiving part 126, the light 121 is removed by the band-pass filter 127.

The fluorescence reflective mirror 128 reflects the fluorescence 122 generated from the upper surface of the ingot 10 toward the light receiving part 126. The fluorescence reflective mirror 128 is a spheroidal mirror in which a reflective surface 129 is formed of part of a curved surface of a spheroid obtained by rotating an ellipse 130, which has a major axis 131 extending in a vertical direction and a minor axis 132 orthogonal to the major axis 131, about the major axis 131.

A spheroidal mirror is known to have a characteristic that it has two foci and light emitted from one focus reaches the other focus after being reflected by an inner surface of the spheroidal mirror. The spheroidal mirror that forms the spheroid in the embodiment has a first focus 133 and a second focus 134. The part irradiated with the light 121 in the upper surface of the ingot 10 is disposed at the position of the first focus 133. The light receiving part 126 is disposed at the second focus 134.

According to such a configuration, when the upper surface of the ingot 10 located at the first focus 133 is irradiated with the light 121, the fluorescence 122 is emitted from the upper surface of the ingot 10 due to the light 121. The fluorescence 122 is reflected by the reflective surface 129 formed of part of the spheroid and is focused toward the second focus 134 to be received by the light receiving part 126 disposed at the second focus 134.

Thus, the fluorescence 122 emitted from the upper surface of the ingot 10 can efficiently be guided to the light receiving part 126 disposed at the second focus 134 through the reflective surface 129, and reduction in loss of the weak fluorescence 122 can be intended. Moreover, in the embodiment, the detection sensitivity can be improved even with the fluorescence 122 with weak intensity because the light receiving part 126 is disposed at the second focus 134.

The laser beam irradiation unit 140 illustrated in FIG. 3 is a unit that irradiates the ingot 10 held on the holding surface 111 of the holding unit 110 with a pulsed laser beam 141 (see FIG. 9 and so forth) of a predetermined wavelength and includes, for example, a laser oscillator that generates the laser beam 141 and an optical system (lens, mirror, and so forth) that guides the laser beam 141 to the ingot 10. For example, part of the optical system of the laser beam irradiation unit 140 is supported by the tip of the support beam 103 extended in the horizontal direction from the upper end part of the erected wall 102 disposed upright from the apparatus main body 101. An irradiation part of the laser beam irradiation unit 140 is disposed adjacent to an irradiation part of the fluorescence detection unit 120.

For example, the laser beam irradiation unit 140 forms a separation layer 25 (see FIG. 9 and so forth) by positioning a focal point 142 (see FIG. 9 and so forth) of the laser beam 141 of a wavelength having transmissibility with respect to the ingot 10 to a depth corresponding to the thickness of the wafer 30 (see FIG. 11 and so forth) to be generated from the upper surface (irradiated surface 24, see FIG. 9 and so forth) of the ingot 10 and executing irradiation.

The movement unit 150 is a unit that moves the holding unit 110 and the focal point 142 of the laser beam 141, with which irradiation is executed by the laser beam irradiation unit 140, with respect to each other in the XY directions parallel to the holding surface 111. The movement unit 150 includes an X-axis direction movement unit 151 and a Y-axis direction movement unit 152.

The X-axis direction movement unit 151 is a unit that moves the holding unit 110 and the focal point 142 of the laser beam 141, with which irradiation is executed by the laser beam irradiation unit 140, with respect to each other in the X-axis direction that is a processing feed direction. The X-axis direction movement unit 151 moves the holding unit 110 in the X-axis direction in the embodiment. The X-axis direction movement unit 151 is mounted over the apparatus main body 101 of the laser processing apparatus 100 in the embodiment. The X-axis direction movement unit 151 supports the X-axis direction moving plate 113 movably in the X-axis direction.

The Y-axis direction movement unit 152 is a unit that moves the holding unit 110 and the focal point 142 of the laser beam 141, with which irradiation is executed by the laser beam irradiation unit 140, with respect to each other in the Y-axis direction that is an indexing feed direction. The Y-axis direction movement unit 152 moves the holding unit 110 in the Y-axis direction in the embodiment. The Y-axis direction movement unit 152 is mounted on the apparatus main body 101 of the laser processing apparatus 100 in the embodiment. The Y-axis direction movement unit 152 supports the Y-axis direction moving plate 114 movably in the Y-axis direction.

The X-axis direction movement unit 151 and the Y-axis direction movement unit 152 each include a well-known ball screw, a well-known pulse motor, and well-known guide rails, for example. The ball screw is disposed rotatably about its axial center. The pulse motor rotates the ball screw about the axial center. The guide rails of the X-axis direction movement unit 151 are disposed fixedly on the Y-axis direction moving plate 114 and support the X-axis direction moving plate 113 movably in the X-axis direction. The guide rails of the Y-axis direction movement unit 152 are disposed fixedly on the apparatus main body 101 and support the Y-axis direction moving plate 114 movably in the Y-axis direction.

The movement unit 150 may further include a Z-axis direction movement unit that moves the holding unit 110 and the focal point 142 of the laser beam 141, with which irradiation is executed by the laser beam irradiation unit 140, with respect to each other in the Z-axis direction that is a focus adjustment direction. The Z-axis direction movement unit moves a light collector of the laser beam irradiation unit 140 in the Z-axis direction.

In the embodiment, the irradiation part of the fluorescence detection unit 120 is disposed adjacent to the irradiation part of the laser beam irradiation unit 140. Therefore, the movement unit 150 is also a unit that moves the holding unit 110 and the irradiation position of the light 121, with which irradiation is executed by the fluorescence detection unit 120, with respect to each other in the XY directions parallel to the holding surface 111.

The display unit 160 is a display part configured by a liquid crystal display device or the like. For example, the display unit 160 causes a display surface to display a screen for setting treatment conditions, the state of the ingot 10 imaged by an imaging unit that is not illustrated in the diagram, the state of treatment operation, two-dimensional data and three-dimensional data generated by the control unit 170 to be described later, and so forth. For example, the imaging unit includes a micro microscope and a macro microscope and is disposed adjacent to the irradiation parts of the fluorescence detection unit 120 and the laser beam irradiation unit 140.

When the display surface of the display unit 160 includes a touch panel, the display unit 160 may include an input part. The input part can accept various kinds of operation such as registration of information regarding the processing contents by an operator. The input part may be an external input device such as a keyboard. In the display unit 160, the information or image displayed on the display surface is changed by operation from the input part or the like. The display unit 160 may include a notifying device. The notifying device issues at least one of sound and light to notify the operator of the laser processing apparatus 100 of predefined notification information. The notifying device may be an external notifying device such as a speaker or a light emitting device.

The control unit 170 controls each of the above-described constituent elements of the laser processing apparatus 100 and causes the laser processing apparatus 100 to execute treatment operation for the ingot 10. The control unit 170 is a computer including a calculation processing device as calculating means, a storing device as storing means, and an input-output interface device as communication means.

The calculation processing device includes a microprocessor such as a central processing unit (CPU), for example. The storing device has a memory such as a read only memory (ROM) or a random access memory (RAM). The calculation processing device executes various kinds of calculation on the basis of a predetermined program stored in the storing device. According to the calculation result, the calculation processing device outputs various control signals to the above-described respective constituent elements through the input-output interface device to execute control of the laser processing apparatus 100.

For example, the control unit 170 causes the fluorescence detection unit 120 to irradiate the ingot 10 held by the holding unit 110 with the light 121 of a predetermined wavelength from above the ingot 10. For example, the control unit 170 acquires the number of photons of the fluorescence 122 that is detected by the fluorescence detection unit 120 and is generated from the upper surface of the ingot 10.

For example, the control unit 170 causes the movement unit 150 to position the focal point 142 of the laser beam 141 with which irradiation is executed by the laser beam irradiation unit 140 to a depth inside the ingot 10 held by the holding unit 110 corresponding to the thickness of the wafer 30 to be generated. For example, the control unit 170 causes the laser beam irradiation unit 140 to execute irradiation with the laser beam 141 of a wavelength having transmissibility with respect to the ingot 10 held by the holding unit 110. For example, the control unit 170 causes the movement unit 150 to move the focal point 142 of the laser beam 141 and the holding unit 110 that holds the ingot 10 with respect to each other in the XY directions.

For example, the control unit 170 causes the display unit 160 to display various kinds of information. For example, the control unit 170 causes the display unit 160 to display the distribution of the number of photons of the fluorescence 122 detected by the fluorescence detection unit 120. The control unit 170 includes a determining section 171, a calculating section 172, an estimating section 173, and a setting section 174. For example, the control unit 170 causes the display unit 160 to display the estimated position of the facet region 21 inside the ingot 10 calculated by the calculating section 172 to be described later. For example, the control unit 170 causes the display unit 160 to display the position of a facet region 21-1 or 21-2 on the irradiated surface 24 (see FIG. 9 and so forth) to be irradiated with the laser beam 141, the facet region 21-1 or 21-2 being estimated by the estimating section 173 to be described later.

The determining section 171 determines the position of a facet region 21-11 (see FIG. 8) in the first surface 11 of the ingot 10 and the position of a facet region 21-12 (see FIG. 8) in the second surface 12 on the basis of the distribution of the number of photons of the fluorescence 122 detected by the fluorescence detection unit 120.

More specifically, the determining section 171 acquires the distribution of the number of photons of the fluorescence 122 in the first surface 11 of the ingot 10 detected in the fluorescence detection unit 120. The determining section 171 determines as the facet region 21-11 a region in which the number of photons of the detected fluorescence 122 is smaller than a predetermined value (a boundary) in the first surface 11. The determining section 171 determines as the non-facet region 22 a region in which the number of photons of the detected fluorescence 122 is equal to or larger than the predetermined value in the first surface 11.

Further, the determining section 171 acquires the distribution of the number of photons of the fluorescence 122 in the second surface 12 of the ingot 10 detected in the fluorescence detection unit 120. The determining section 171 determines as the facet region 21-12 a region in which the number of photons of the detected fluorescence 122 is smaller than a predetermined value (a boundary) in the second surface 12. The determining section 171 determines as the non-facet region 22 a region in which the number of photons of the detected fluorescence 122 is equal to or larger than the predetermined value in the second surface 12.

The calculating section 172 calculates the estimated position of the facet region 21 inside the ingot 10 on the basis of the position of the facet region 21-11 in the first surface 11 and the position of the facet region 21-12 in the second surface 12 determined by the determining section 171. Specifically, the calculating section 172 regards, as the estimated position of the facet region 21 inside the ingot 10, a region surrounded when an outer edge part of the facet region 21-11 in the first surface 11 and an outer edge part of the facet region 21-12 in the second surface 12 are linked. That is, the facet region 21 inside the ingot 10 has a frustum shape that has the facet region 21-11 of the first surface 11 as an upper bottom surface and has the facet region 21-12 of the second surface 12 as a lower bottom surface.

The estimating section 173 estimates the position of the facet region 21-1 or 21-2 on the irradiated surface 24 (see FIG. 9 and so forth) to be irradiated with the laser beam 141. In the embodiment, it is assumed that a horizontal section of the facet region 21 inside the ingot 10 linearly changes from the facet region 21-11 of the first surface 11 to the facet region 21-12 of the second surface 12. According to this assumption, the facet region 21-1 or 21-2 on the irradiated surface 24 can be estimated based on the estimated position of the facet region 21 inside the ingot 10 calculated by the calculating section 172 and the thickness from the second surface 12 of the ingot 10 to the irradiated surface 24.

The thickness from the second surface 12 of the ingot 10 to the irradiated surface 24 decreases every time the wafer 30 is separated from the ingot 10. That is, the estimating section 173 estimates the position of the facet region 21-1 or 21-2 on the irradiated surface 24 on the basis of the estimated position of the facet region 21 inside the ingot 10 calculated by the calculating section 172 and the thickness of the ingot 10 that has decreased due to separation of the wafer 30 from the ingot 10.

The setting section 174 sets an irradiation condition of the laser beam 141 for forming the separation layer 25 inside the ingot 10. The setting section 174 sets an irradiation condition of the laser beam 141 with which the facet region 21-1 or 21-2 on the irradiated surface 24 estimated by the estimating section 173 is to be irradiated to an irradiation condition different from that of the laser beam 141 with which the non-facet region 22 is to be irradiated.

(Facet Region Detection Method and Wafer Generation Method)

Figure 5:
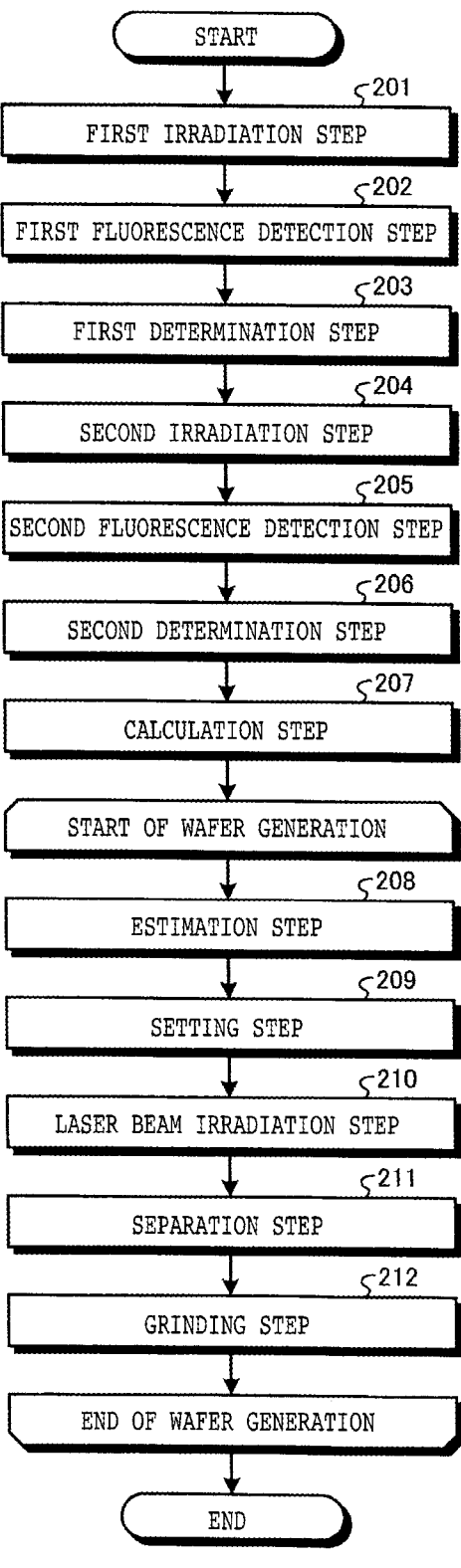
FIG. 5 is a flowchart illustrating a flow of the facet region detection method and a wafer generation method according to the embodiment.

Next, the method for detecting the facet region 21 and the method for generating the wafer 30 according to the embodiment of the present invention will be described. FIG. 5 is a flowchart illustrating a flow of the method for detecting the facet region 21 and the method for generating the wafer 30 according to the embodiment. The method for detecting the facet region 21 has a first irradiation step 201, a first fluorescence detection step 202, a first determination step 203, a second irradiation step 204, a second fluorescence detection step 205, a second determination step 206, and a calculation step 207.

Further, the method for generating the wafer 30 is executed after the calculation step 207 and has an estimation step 208, a setting step 209, a laser beam irradiation step 210, a separation step 211, and a grinding step 212. The estimation step 208, the setting step 209, the laser beam irradiation step 210, the separation step 211, and the grinding step 212 are repeatedly executed while a plurality of wafers 30 are generated from one ingot 10.

<First Irradiation Step 201>

Figure 6:
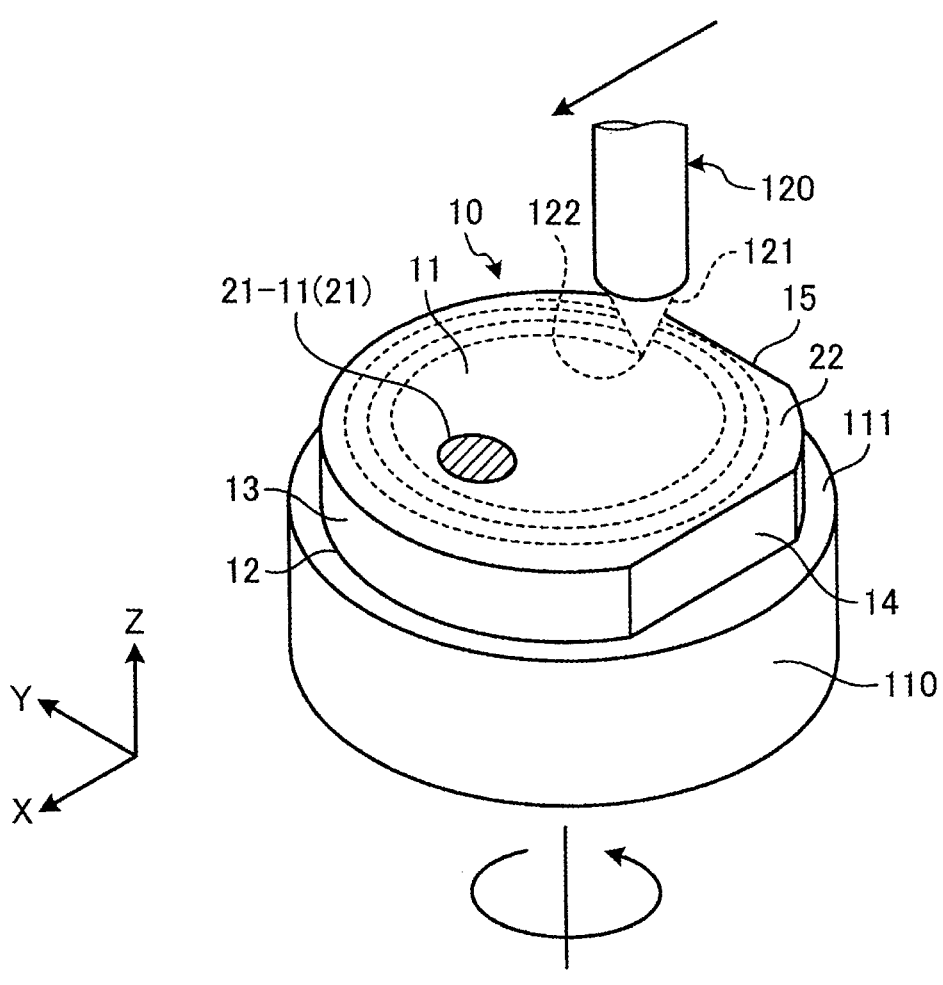
FIG. 6 is a perspective view illustrating a first irradiation step illustrated in FIG. 5.

FIG. 6 is a perspective view illustrating the first irradiation step 201 illustrated in FIG. 5. The first irradiation step 201 is a step of irradiating the first surface 11 of the ingot 10 with the light 121 from the light source 123 (see FIG. 4).

In the first irradiation step 201, first, the side of the second surface 12 of the ingot 10 is held under suction on the holding surface 111 of the holding unit 110. Next, the height of the fluorescence detection unit 120 is adjusted to cause the first focus 133 (see FIG. 4) of the fluorescence detection unit 120 to be located at the first surface 11 of the ingot 10. In addition, the holding unit 110 is moved by the movement unit 150 to cause the irradiation part of the fluorescence detection unit 120 to face a circumferential edge of the first surface 11 of the ingot 10.

In this state, by the rotation unit 112, the holding unit 110 is rotated at a predetermined rotation speed (for example, 900° /sec), and the ingot 10 is rotated in a predetermined direction (arrow direction illustrated at a lower part of FIG. 6). While the upper surface (first surface 11) of the ingot 10 is continuously irradiated with the light 121 by the fluorescence detection unit 120, the holding unit 110 is moved in such a manner that the fluorescence detection unit 120 moves from the circumferential edge of the ingot 10 toward the center in a radial direction (arrow direction illustrated at an upper part of FIG. 6). This causes the fluorescence detection unit 120 to pass through a spiral locus drawn from the circumferential edge of the ingot 10 toward the center.

<First Fluorescence Detection Step 202>

Figure 7:
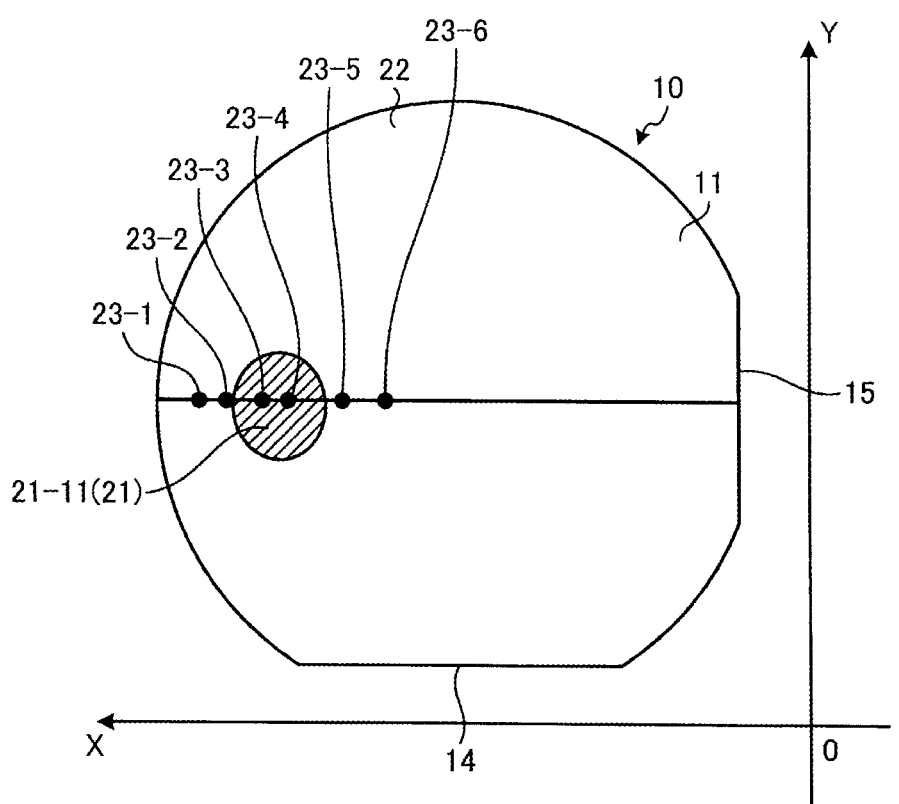
FIG. 7 is a diagram illustrating examples of XY coordinate positions at which fluorescence is detected in a first fluorescence detection step illustrated in FIG. 5.

FIG. 7 is a diagram illustrating examples of XY coordinate positions at which fluorescence is detected in the first fluorescence detection step 202 illustrated in FIG. 5. Table 1 is a table illustrating examples of the number of photons of the fluorescence detected at the XY coordinate positions illustrated in FIG. 7.

TABLE 1

| | XY coordinate position | Number of photons (cps) |
|---|---|---|
| Detection position 23-1 | x1, y1 | 5000 |
| Detection position 23-2 | x2, y1 | 4000 |
| Detection position 23-3 | x3, y1 | 2500 |
| Detection position 23-4 | x4, y1 | 1000 |
| Detection position 23-5 | x5, y1 | 4000 |
| Detection position 23-6 | x6, y1 | 5000 |

The first fluorescence detection step 202 is a step of detecting the fluorescence 122 generated from the first surface 11 of the ingot 10 by the light 121 with which the first surface 11 is irradiated and obtaining the distribution of the number of photons of the fluorescence 122. In the first fluorescence detection step 202, the fluorescence detection unit 120 acquires the number of photons of the fluorescence 122 generated from the first surface 11 of the ingot 10. At this time, in the first fluorescence detection step 202, the XY coordinate position of the position irradiated with the light 121 when the number of photons of the fluorescence 122 is acquired is acquired. Data of the distribution of the number of photons of the fluorescence 122 acquired in the first fluorescence detection step 202 is stored in the storing device of the control unit 170, for example.

In the first fluorescence detection step 202, for example, regarding detection positions 23-1, 23-2, 23-3, 23-4, 23-5, and 23-6 illustrated in FIG. 7, distribution information of the number of photons of the fluorescence 122 indicated in Table 1 is obtained. Specifically, in the first fluorescence detection step 202, six coordinates (x1, y1), (x2, y1), (x3, y1), (x4, y1), (x5, y1), and (x6, y1) and six numbers of photons (5000 count per second (cps)), (4000 cps), (2500 cps), (1000 cps), (4000 cps), and (5000 cps) are acquired in such a manner that each of the coordinates is associated with a respective one of the numbers of photons.

<First Determination Step 203>

The first determination step 203 is a step of determining the facet region 21-11 and the non-facet region 22 in the first surface 11. More specifically, in the first determination step 203, the determining section 171 of the control unit 170 determines as the facet region 21-11 a region in which the number of photons of the fluorescence 122 detected in the first fluorescence detection step 202 is smaller than the predetermined value in the first surface 11. Further, in the first determination step 203, the determining section 171 of the control unit 170 determines as the non-facet region 22 a region in which the number of photons of the fluorescence 122 detected in the first fluorescence detection step 202 is equal to or larger than the predetermined value in the first surface 11.

As in the embodiment illustrated in FIG. 7 and Table 1, when the predetermined value is set to 4000, the detection positions 23-3 and 23-4 exist in the facet region 21-11, and the detection positions 23-1, 23-2, 23-5, and 23-6 exist in the non-facet region 22.

<Second Irradiation Step 204>

The second irradiation step 204 is a step of irradiating the second surface 12 of the ingot 10 with the light 121 from the light source 123. The second irradiation step 204 is the same as the first irradiation step 201 except that the second irradiation step 204 has a procedure obtained by interchanging the first surface 11 and the second surface 12 in the procedure of the first irradiation step 201, and therefore, description thereof is omitted.

<Second Fluorescence Detection Step 205>

The second fluorescence detection step 205 is a step of detecting the fluorescence 122 generated from the second surface 12 of the ingot 10 by the light 121 with which the second surface 12 is irradiated and obtaining the distribution of the number of photons of the fluorescence 122. The second fluorescence detection step 205 is the same as the first fluorescence detection step 202 except that the second fluorescence detection step 205 has a procedure obtained by replacing the first surface 11 by the second surface 12 in the procedure of the first fluorescence detection step 202, and therefore, description thereof is omitted.

<Second Determination Step 206>

The second determination step 206 is a step of determining as the facet region 21-12 a region in which the number of photons of the fluorescence 122 detected in the second fluorescence detection step 205 is smaller than the predetermined value in the second surface 12 and determining as the non-facet region 22 a region in which the number of photons of the fluorescence 122 is equal to or larger than the predetermined value. The second determination step 206 is the same as the first determination step 203 except that the second determination step 206 has a procedure obtained by replacing the first surface 11 by the second surface 12 in the procedure of the first determination step 203, and therefore, description thereof is omitted.

<Calculation Step 207>

Figure 8:
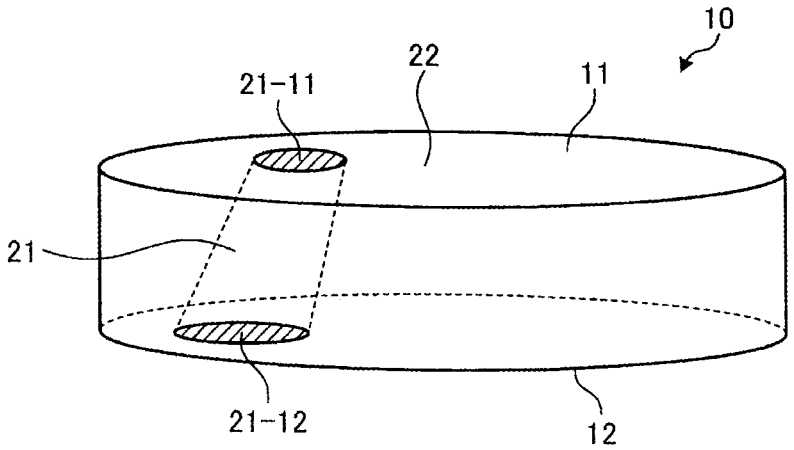
FIG. 8 is a diagram illustrating one example of an estimated position of a facet region calculated in a calculation step illustrated in FIG. 5.

FIG. 8 is a diagram illustrating one example of the estimated position of the facet region 21 calculated in the calculation step 207 illustrated in FIG. 5. The calculation step 207 is a step of calculating the estimated position of the facet region 21 inside the ingot 10. In the calculation step 207, the calculating section 172 of the control unit 170 calculates the estimated position of the facet region 21 inside the ingot 10 on the basis of the region determined as the facet region 21-11 in the first surface 11 in the first determination step 203 and the region determined as the facet region 21-12 in the second surface 12 in the second determination step 206. Specifically, in the calculation step 207, a frustum that has the facet region 21-11 of the first surface 11 as the upper bottom surface and has the facet region 21-12 of the second surface 12 as the lower bottom surface is calculated, and the region inside the calculated frustum is regarded as the estimated position of the facet region 21 inside the ingot 10.

<Estimation Step 208>

The estimation step 208 is a step of estimating the position of the facet region 21 on the irradiated surface 24 (see FIG. 9 and so forth) to be irradiated with the laser beam 141. In the estimation step 208 of the embodiment, the position of the facet region 21 on the irradiated surface 24 is estimated based on the assumption that the horizontal section of the facet region 21 inside the ingot 10 linearly changes from the facet region 21-11 of the first surface 11 to the facet region 21-12 of the second surface 12.

An irradiated surface 24-1 or 24-2 (see FIG. 9 and FIG. 10) irradiated with the laser beam 141 moves to the lower side every time the wafer 30 is separated from the ingot 10. That is, the thickness from the second surface 12 of the ingot 10 to the irradiated surface 24-1 or 24-2 decreases every time the wafer 30 is separated from the ingot 10.

Specifically, in the estimation step 208, first, the thickness of the ingot 10 that has decreased due to separation of the wafer 30 from the ingot 10, which is the thickness from the second surface 12 of the ingot 10 to the irradiated surface 24, is calculated. In the estimation step 208, next, the position of the facet region 21-1 or 21-2 on the irradiated surface 24-1 or 24-2 is estimated based on the estimated position of the facet region 21 inside the ingot 10 calculated in the calculation step 207 and the thickness of the ingot 10 that has decreased due to separation of the wafer 30 from the ingot 10.

<Setting Step 209>

The setting step 209 is executed before the laser beam irradiation step 210. The setting step 209 is a step of setting the irradiation condition of the laser beam 141 for forming the separation layer 25 (see FIG. 9 and FIG. 10) inside the ingot 10. In the setting step 209, the irradiation condition of the laser beam 141 with which the facet region 21-1 or 21-2 on the irradiated surface 24-1 or 24-2 estimated in the estimation step 208 is to be irradiated is set to a different irradiation condition from that of the laser beam 141 with which the non-facet region 22 is to be irradiated.

In the setting step 209, as the different irradiation condition, for example, energy of the laser beam 141 may be set to become higher in the case of irradiation of the facet region 21-1 or 21-2 than in the case of irradiation of the non-facet region 22. Further, in the setting step 209, as the different irradiation condition, for example, the position of the light collector of the laser beam irradiation unit 140 may be set to become a higher position in the case of irradiation of the facet region 21-1 or 21-2 than in the case of irradiation of the non-facet region 22. Moreover, in the setting step 209, as the different irradiation condition, for example, an overlapping rate of the laser beam 141 may be set to become higher in the case of irradiation of the facet region 21-1 or 21-2 than in the case of irradiation of the non-facet region 22.

<Laser Beam Irradiation Step 210>

Figure 9:
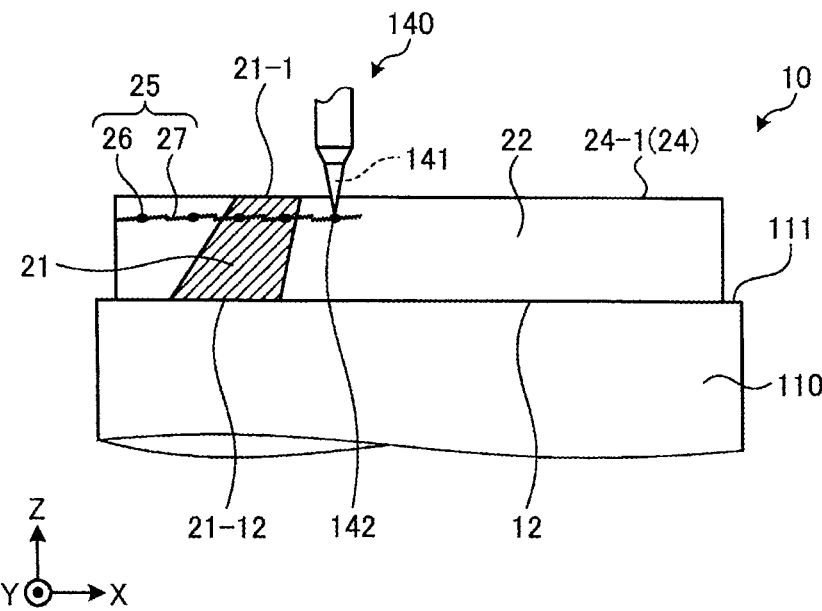
FIG. 9 is a side view, partially in cross section, illustrating one state of a laser beam irradiation step illustrated in FIG. 5.
Figure 10:
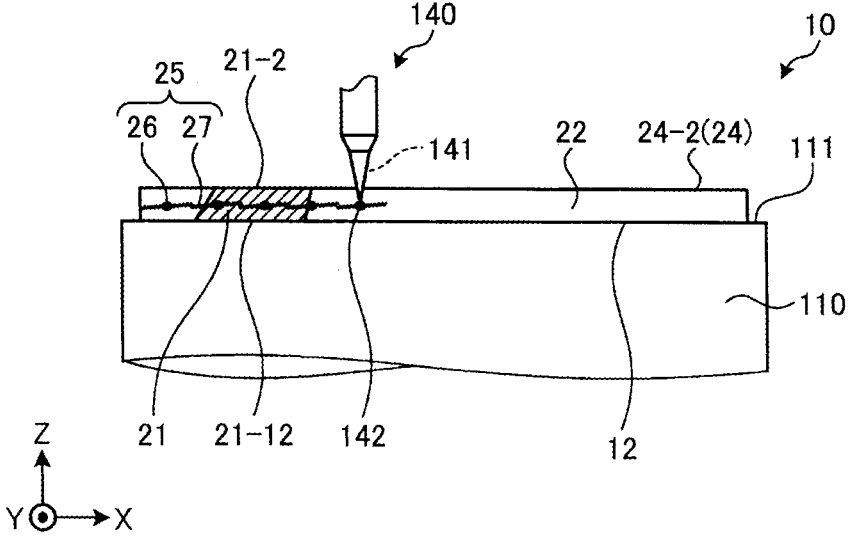
FIG. 10 is a side view, partially in cross section, illustrating another state of the laser beam irradiation step illustrated in FIG. 5.

FIG. 9 is a side view, partially in cross section, illustrating one state of the laser beam irradiation step 210 illustrated in FIG. 5. FIG. 10 is a side view, partially in cross section, illustrating another state of the laser beam irradiation step 210 illustrated in FIG. 5. The laser beam irradiation step 210 is a step of forming the separation layer 25 by using the laser beam 141 at a depth inside the ingot 10 corresponding to the thickness of the wafer 30 to be generated.

In the laser beam irradiation step 210, first, the side of the second surface 12 of the ingot 10 is held under suction on the holding surface 111 of the holding unit 110. Next, the focal point 142 of the laser beam 141 is positioned to the depth inside the ingot 10 corresponding to the thickness of the wafer 30 (see FIG. 11) to be generated. The laser beam 141 is a pulsed laser beam with a wavelength having transmissibility with respect to the ingot 10. Next, in the laser beam irradiation step 210, the irradiated surface 24 of the ingot 10 is irradiated with the laser beam 141 while the focal point 142 and the ingot 10 are moved with respect to each other in directions (XY directions) parallel to the first surface 11.

Here, the irradiation condition of the laser beam 141 is the condition set in the setting step 209. That is, because the estimated positions of the facet regions 21-1 and 21-2 differ in association with the thicknesses from the second surface 12 to the irradiated surfaces 24-1 and 24-2, the XY positions at which the irradiation condition of the laser beam 141 is changed differ for each of the irradiated surfaces 24-1 and 24-2.

In the laser beam irradiation step 210, SiC is separated into silicon (Si) and carbon (C) by the irradiation with the pulsed laser beam 141. Further, modified parts 26 arising from absorption of the pulsed laser beam 141, with which irradiation is executed next, by the previously-formed C and separation of SiC into Si and C in a chain-reaction manner are formed inside the ingot 10 along the processing feed direction. In addition, cracks 27 that extend along the c-plane 19 (see FIG. 2) are generated from the modified parts 26. In this manner, the separation layer 25 including the modified parts 26 and the cracks 27 formed from the modified parts 26 along the c-plane 19 is formed in the laser beam irradiation step 210.

<Separation Step 211>

Figure 11:
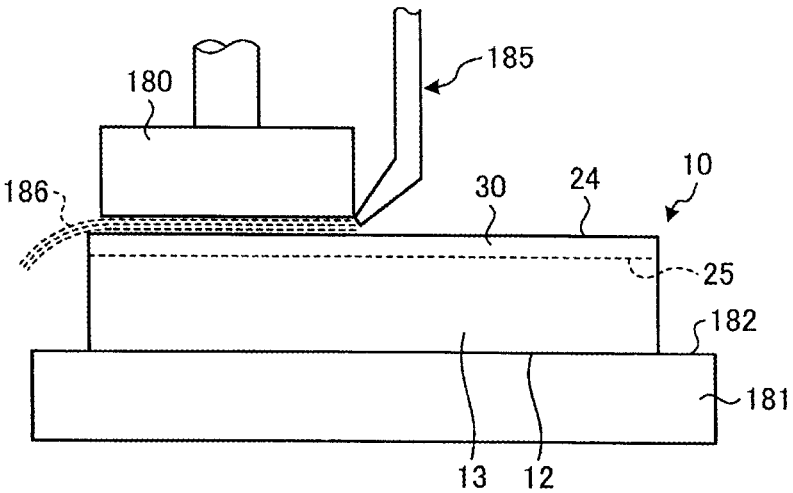
FIG. 11 is a diagram illustrating one example of a separation step illustrated in FIG. 5.

FIG. 11 is a diagram illustrating one example of the separation step 211 illustrated in FIG. 5. The separation step 211 is a step of separating the wafer 30 to be generated from the ingot 10, with the separation layer 25 being the interface.

In the separation step 211, the wafer 30 is separated from the ingot 10 by giving ultrasonic to the ingot 10 by an ultrasonic oscillating unit 180. Part of the ingot 10 on the side of the irradiated surface 24 is thus separated with the separation layer 25 being the interface, and the separated part is generated as the wafer 30. The ultrasonic oscillating unit 180 may be included in the laser processing apparatus 100 (detection apparatus). For example, the ultrasonic oscillating unit 180 includes an ultrasonic power supply and an ultrasonic oscillator formed from a piezoelectric ceramic or the like to which a voltage is applied by the ultrasonic power supply.

In the separation step 211, first, the side of the second surface 12 of the ingot 10 is held under suction on a holding surface 182 of a holding unit 181. Next, the ultrasonic oscillator of the ultrasonic oscillating unit 180 is made to face the irradiated surface 24 of the ingot 10. Next, liquid 186 is supplied from a liquid supply unit 185 to between the ultrasonic oscillator and the ingot 10.

In this state, a voltage is applied from the ultrasonic power supply of the ultrasonic oscillating unit 180 to cause ultrasonic vibration of the ultrasonic oscillator. Ultrasonic vibration with a frequency according to the vibration of the ultrasonic oscillator is thus propagated in the liquid 186 and is given to the ingot 10. By giving the ultrasonic vibration to the whole surface of the ingot 10, part of the ingot 10 on the side of the irradiated surface 24 is separated with the separation layer 25 formed in the laser beam irradiation step 210 being the interface.

<Grinding Step 212>

Figure 12:
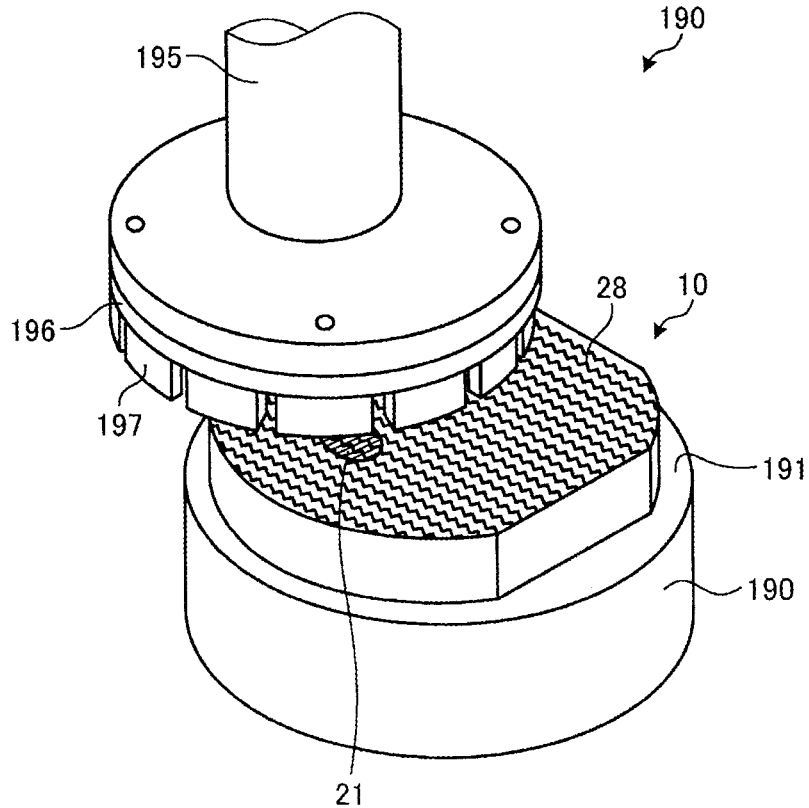
FIG. 12 is a diagram illustrating one example of a grinding step illustrated in FIG. 5.

FIG. 12 is a diagram illustrating one example of the grinding step 212 illustrated in FIG. 5. The grinding step 212 is executed after the separation step 211. The grinding step 212 is a step of grinding a separation surface 28 of the ingot 10.

In the grinding step 212, the separation surface 28 from which the wafer 30 has been separated in the separation step 211 is ground by a grinding unit 190. The grinding unit 190 may be included in the laser processing apparatus 100 (detection apparatus). The grinding unit 190 includes a spindle 195 that is a rotating shaft component, a wheel base 196 attached to a lower end of the spindle 195, grinding abrasive stones 197 mounted on a lower surface of the wheel base 196, and a grinding water supply nozzle that supplies grinding water and is not illustrated in the diagram.

In the grinding step 212, first, the side of the second surface 12 of the ingot 10 is held under suction on a holding surface 192 of a holding unit 191. Next, the wheel base 196 is rotated about its axial center in the state in which the holding unit 191 is being rotated about its axial center. The wheel base 196 rotates about a rotation axis parallel to the axial center of the holding unit 191. By supplying the grinding water from the grinding water supply nozzle and bringing the grinding abrasive stones 197 mounted on the lower surface of the wheel base 196 closer to the holding unit 191 at a predetermined feed rate, the ingot 10 is ground on the side of the separation surface 28 by the grinding abrasive stones 197. Irregularities in the separation surface 28 of the ingot 10 are thus removed.

When the grinding step 212 ends, a return to the estimation step 208 is made, and the steps from the estimation step 208 to the grinding step 212 are repeatedly executed until a predetermined number of wafers 30 are generated from the ingot 10. The surface resulting from the grinding of the separation surface 28 in the grinding step 212 is treated as the next irradiated surface 24 in the subsequent estimation step 208.

As described above, the method for detecting the facet region 21 of the ingot 10 and the detection apparatus according to the embodiment detect each of the facet region 21-11 of the upper surface (first surface 11) of the ingot 10 and the facet region 21-12 of a lower surface (second surface 12 ) and calculate the estimated position of the facet region 21 inside the ingot 10 on the basis of the detected regions. The calculation of the estimated position of the facet region 21 inside the ingot 10 is executed in advance before generation of the wafer 30 from the ingot 10.

Further, the method for generating the wafer 30 and the laser processing apparatus 100 estimate the position of the facet region 21-1 or 21-2 on the irradiated surface 24 on the basis of the estimated position of the facet region 21 inside the ingot 10 and the thickness from the lower surface (second surface 12 ) of the ingot 10 to the irradiated surface 24 (height position of the irradiated surface 24 in the Z-axis direction). This eliminates the need to detect the facet region 21 every time the wafer 30 is separated, and therefore, contributes to improvement in the productivity.

Specifically, in the existing technique, a detection time taken for one ingot 10 is $n \times T$ minutes when n denotes the number of wafers 30 generated from the ingot 10 and T denotes a detection time (minute) taken to detect the facet region 21 on one irradiated surface 24. In contrast to this, in the embodiment, it suffices that detection is executed regarding two surfaces, that is, the first surface 11 and the second surface 12. Therefore, the detection time taken for one ingot 10 becomes $2 \times T$ minutes, and the time can drastically be shortened compared with the existing technique.

The present invention is not limited to the above-described embodiment. That is, the present invention can be carried out with various modifications without departing from the gist of the present invention.

For example, in the embodiment, it is assumed that the horizontal section of the facet region 21 inside the ingot 10 linearly changes. However, in the present invention, for example, the facet region 21 inside the ingot 10 may be estimated based on a change curve stored in the detection apparatus in advance.

Furthermore, in the first irradiation step 201 and the second irradiation step 204, in the embodiment, the fluorescence detection unit 120 is moved from the circumferential edge of the ingot 10 toward the center in the radial direction by moving the side of the holding unit 110. However, in the present invention, the side of the fluorescence detection unit 120 may be moved.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A facet region detection method for detecting a facet region of an SiC single-crystal ingot having a first surface and a second surface that is a surface on a side opposite to the first surface, the facet region detection method comprising:

a first irradiation step of irradiating the first surface of the SiC single-crystal ingot with light from a light source;

a first fluorescence detection step of detecting fluorescence generated from the first surface of the SiC single-crystal ingot by the light with which the first surface is irradiated and obtaining distribution of the number of photons of the fluorescence;

a first determination step of determining a facet region and a non-facet region in the first surface on a basis of the number of photons of the fluorescence detected in the first fluorescence detection step with a predetermined value as a boundary;

a second irradiation step of irradiating the second surface of the SiC single-crystal ingot with light from the light source;

a second fluorescence detection step of detecting fluorescence generated from the second surface of the SiC single-crystal ingot by the light with which the second surface is irradiated and obtaining distribution of the number of photons of the fluorescence;

a second determination step of determining a facet region and a non-facet region in the second surface on a basis of the number of photons of the fluorescence detected in the second fluorescence detection step with a predetermined value as a boundary; and a calculation step of calculating an estimated position of a facet region inside the SiC single-crystal ingot on a basis of the facet region determined in the first surface in the first determination step and the facet region determined in the second surface in the second determination step.

2. A wafer generation method for generating a wafer from an SiC single-crystal ingot having a first surface and a second surface that is a surface on a side opposite to the first surface, the wafer generation method comprising:

a first irradiation step of irradiating the first surface of the SiC single-crystal ingot with light from a light source;

a first fluorescence detection step of detecting fluorescence generated from the first surface of the SiC single-crystal ingot by the light with which the first surface is irradiated and obtaining distribution of the number of photons of the fluorescence;

a first determination step of determining a facet region and a non-facet region in the first surface on a basis of the number of photons of the fluorescence detected in the first fluorescence detection step with a predetermined value as a boundary;

a second irradiation step of irradiating the second surface of the SiC single-crystal ingot with light from the light source;

a second fluorescence detection step of detecting fluorescence generated from the second surface of the SiC single-crystal ingot by the light with which the second surface is irradiated and obtaining distribution of the number of photons of the fluorescence;

a second determination step of determining a facet region and a non-facet region in the second surface on a basis of the number of photons of the fluorescence detected in the second fluorescence detection step with a predetermined value as a boundary;

a calculation step of calculating an estimated position of a facet region inside the SiC single-crystal ingot on a basis of the facet region determined in the first surface in the first determination step and the facet region determined in the second surface in the second determination step;

a laser beam irradiation step of positioning a focal point of a laser beam of a wavelength having transmissibility with respect to the SiC single-crystal ingot to a depth inside the SiC single-crystal ingot corresponding to a thickness of the wafer to be generated, executing irradiation, and forming a separation layer in the SiC single-crystal ingot by moving the focal point and the SiC single-crystal ingot with respect to each other in directions parallel to the first surface;

a separation step of separating the wafer to be generated from the SiC single-crystal ingot with the separation layer being an interface;

a grinding step of grinding a separation surface of the SiC single-crystal ingot after the separation step;

an estimation step of estimating a position of a facet region on an irradiated surface to be irradiated with the laser beam on a basis of the estimated position of the facet region inside the SiC single-crystal ingot calculated in the calculation step and a thickness of the SiC single-crystal ingot that has decreased due to the separation of the wafer from the SiC single-crystal ingot, after the calculation step and before the laser beam irradiation step; and a setting step of setting an irradiation condition of the laser beam with which the estimated facet region on the irradiated surface is to be irradiated to an irradiation condition different from that of the laser beam with which the non-facet region is to be irradiated, after the estimation step and before the laser beam irradiation step.

* * * * *